US00RE39484E

(19) United States
(12) Reissued Patent
Bruel

(10) Patent Number: US RE39,484 E
(45) Date of Reissued Patent: Feb. 6, 2007

(54) PROCESS FOR THE PRODUCTION OF THIN SEMICONDUCTOR MATERIAL FILMS

(75) Inventor: Michel Bruel, Veurey (FR)

(73) Assignee: Commissariat a l'energie Atomique, Paris (FR)

(21) Appl. No.: 10/449,786

(22) Filed: May 30, 2003

Related U.S. Patent Documents

Reissue of:
(64) Patent No.: 5,374,564
Issued: Dec. 20, 1994
Appl. No.: 07/945,001
Filed: Sep. 15, 1992

(30) Foreign Application Priority Data

Sep. 18, 1991 (FR) ..... 91 11491

(51) Int. Cl.
*H01L 21/42* (2006.01)
*H01L 21/324* (2006.01)
*H01L 21/477* (2006.01)
*H01L 29/12* (2006.01)

(52) U.S. Cl. ..... 438/455; 438/766; 438/798; 438/458; 438/459; 148/12

(58) Field of Classification Search ..... 438/458, 438/459, 766, 798; 148/33.3, DIG. 12
See application file for complete search history.

(56) References Cited

U.S. PATENT DOCUMENTS

| | | | |
|---|---|---|---|
| 3,901,423 | A | 8/1975 | Hillberry et al. |
| 3,915,757 | A | 10/1975 | Engel |
| 3,957,107 | A | 5/1976 | Altoz et al. |
| 3,993,909 | A | 11/1976 | Drews et al. |
| 4,006,340 | A | 2/1977 | Gorinas |
| 4,039,416 | A | 8/1977 | White |
| 4,074,139 | A | 2/1978 | Pankove |
| 4,107,350 | A | 8/1978 | Berg et al. |

(Continued)

FOREIGN PATENT DOCUMENTS

| | | | |
|---|---|---|---|
| EP | 0 35 5913 | | 2/1990 |
| GB | 2 211 991 | | 7/1989 |
| GB | 2211991 A | * | 7/1989 |
| JP | 53-104156 | * | 9/1978 |
| JP | 59-54217 | * | 3/1984 |
| RU | 1282757 | | 6/2000 |

OTHER PUBLICATIONS

Ascheron, C., "A Comparative Study of Swelling, Radiation, Strain and Radiation Damage of High–Energy Proton–bombarded GaAs, GaP, InP, Si and Ge Single Crystals, Nuclear Instruments and Methods in Physics Research" *Nuclear Instruments and Methods in Physics Research* B36(1989) 163–172.

(Continued)

*Primary Examiner*—Laura Schillinger
(74) *Attorney, Agent, or Firm*—Brinks Hofer Gilson & Lione

(57) ABSTRACT

Process for the preparation of thin monocrystalline or polycrystalline semiconductor material films, characterized in that it comprises subjecting a semiconductor material wafer having a planar face to the three following stages: a first stage of implantation by bombardment (2) of the face (4) of the said wafer (1) by means of ions creating in the volume of said wafer a layer (3) of gaseous microbubbles defining in the volume of said wafer a lower region (6) constituting the mass of the substrate and an upper region (5) constituting the thin film, a second stage of intimately contacting the planar face (4) of said wafer with a stiffener (7) constituted by at least one rigid material layer, a third stage of heat treating the assembly of said wafer (1) and said stiffener (7) at a temperature above that at which the ion bombardment (2) was carried out and sufficient to create by a crystalline rearrangement effect in said wafer (1) and a pressure effect in the said microbubbles, a separation between the thin film (5) and the mass of the substrate (6).

70 Claims, 1 Drawing Sheet

U.S. PATENT DOCUMENTS

| | | | | | |
|---|---|---|---|---|---|
| 4,108,751 | A | | 8/1978 | King | |
| 4,121,334 | A | | 10/1978 | Wallis | |
| 4,170,662 | A | | 10/1979 | Weiss et al. | |
| 4,179,324 | A | | 12/1979 | Kirkpatrick | |
| 4,244,348 | A | | 1/1981 | Wilkes | |
| 4,252,837 | A | | 2/1981 | Auton | |
| 4,274,004 | A | | 6/1981 | Kanai | |
| 4,342,631 | A | | 8/1982 | White et al. | |
| 4,346,123 | A | | 8/1982 | Kaufmann | |
| 4,361,600 | A | | 11/1982 | Brown | |
| 4,368,083 | A | * | 1/1983 | Bruel et al. | 438/536 |
| 4,412,868 | A | | 11/1983 | Brown et al. | |
| 4,452,644 | A | | 6/1984 | Bruel et al. | |
| 4,468,309 | A | | 8/1984 | White | |
| 4,471,003 | A | | 9/1984 | Cann | |
| 4,486,247 | A | | 12/1984 | Ecer et al. | |
| 4,490,190 | A | | 12/1984 | Speri | |
| 4,500,563 | A | | 2/1985 | Ellenberger et al. | |
| 4,508,056 | A | | 4/1985 | Bruel et al. | |
| 4,536,657 | A | | 8/1985 | Bruel | |
| 4,539,050 | A | | 9/1985 | Kramler et al. | |
| 4,566,403 | A | | 1/1986 | Fournier | |
| 4,567,505 | A | | 1/1986 | Pease | |
| 4,568,563 | A | | 2/1986 | Jackson et al. | |
| 4,585,945 | A | | 4/1986 | Bruel et al. | |
| 4,630,093 | A | * | 12/1986 | Yamaguchi et al. | 428/66.7 |
| 4,684,535 | A | | 8/1987 | Heinecke et al. | |
| 4,704,302 | A | | 11/1987 | Bruel et al. | |
| 4,717,683 | A | | 1/1988 | Parrillo et al. | |
| 4,764,394 | A | | 8/1988 | Conrad | |
| 4,837,172 | A | | 6/1989 | Mizuno et al. | |
| 4,846,928 | A | | 7/1989 | Dolins et al. | |
| 4,847,792 | A | | 7/1989 | Barna et al. | |
| 4,853,250 | A | | 8/1989 | Boulos et al. | |
| 4,887,005 | A | | 12/1989 | Rough et al. | |
| 4,894,709 | A | | 1/1990 | Phillips et al. | |
| 4,904,610 | A | * | 2/1990 | Shyr | 438/463 |
| 4,929,566 | A | * | 5/1990 | Beitman | 438/407 |
| 4,931,405 | A | * | 6/1990 | Kamijo et al. | |
| 4,948,458 | A | | 8/1990 | Ogle | |
| 4,952,273 | A | | 8/1990 | Popov | |
| 4,960,073 | A | | 10/1990 | Suzuki et al. | |
| 4,975,126 | A | | 12/1990 | Margail et al. | |
| 4,982,090 | A | | 1/1991 | Wittmaack | |
| 4,996,077 | A | | 2/1991 | Moslehi et al. | |
| 5,013,681 | A | * | 5/1991 | Godbey et al. | 438/459 |
| 5,015,353 | A | | 5/1991 | Hubler et al. | |
| 5,034,343 | A | * | 7/1991 | Rouse et al. | 438/400 |
| 5,036,023 | A | * | 7/1991 | Dautremont-Smith et al. | 438/605 |
| 5,120,666 | A | * | 6/1992 | Gotou | 438/164 |
| 5,198,371 | A | * | 3/1993 | Li | 438/475 |
| 5,200,805 | A | * | 4/1993 | Parsons et al. | 257/77 |
| 5,232,870 | A | * | 8/1993 | Ito et al. | 438/455 |
| 5,256,581 | A | * | 10/1993 | Foerstner et al. | 438/459 |
| 5,374,564 | A | * | 12/1994 | Bruel | 438/455 |

OTHER PUBLICATIONS

Ascheron, C., "A Study of Proton Bombardment Induced Swelling of GaP Single Crystals" *phys. stat. sol.* (a) 92, 169 (1985).

Ascheron, C., "Gettering of Copper in Proton–and Helium–Bombarded Buried Regions of Gallium Phosphide" *phys. stat. sol.* (a) 106, 73 (1988).

Ascheron, C., "Investigations of Hydrogen Implanted GaP Single Crystals by Means of Particle Induced γ–Spectroscopy, Infrared Spectroscopy, and Turyherford Backscattering Channeling Technique" *phys. stat. sol.* (a) 89, 549 (1985).

Ascheron, C., "Proton Beam Modification of Selected $A^{III}$ $B^{V}$ Compounds" *phys. stat. sol.* (a) 124, 11 (1991).

Ascheron, C., "Swelling, Strain, and Radiation Damage of He+ Implanted GaP" *phys. stat. sol.* (a) 96, 555 (1986).

Ascheron, C., "The Effect of Hydrogen Implantation Induced Stress on GaP Single Crystals" *Nuclear Instruments and Methods in Physics Research* B28 (1987) 350–359.

Bruel, M., "Silicon–On–Insulator" *European Semiconductor,* Mar. 1997.

Chu et al, "Radiation Damage of 50–250 keV Hydrogen Ions in Silicon", Ion Implantation in Semiconductors, eds. F. Chernob et al., Plenum New York 1976, pp. 483–492.

EerNisse, E., "Compaction of ion–implanted fused silica" *Journal of Applied Physics,* vol. 45, No. 1, Jan. 1974.

EerNisse, E.P., "Role of Integrated Lateral Stress in Surface Deformation of He–implanted Surfaces" *Journal of Applied Physics,* vol. 48, No. 1, Jan. 1977.

Evans, J.H., "An Interbubble Fracture Mechanism Of Blister Formation On Helium–Irradiated Metals" *Journal of Nuclear Materials* 68(1977) 129–140.

Gerasimenko, N., "Infrared Absorption of Silicon Irradiated by Protons" *phys. stat.sol.* (b) 90, 689 (1978).

Greenwald, A.C., "Pulsed–electron–beam annealing of ion–implantation damage" *J. Appl. Phys.* 50(2), Feb. 1978.

Johnson, P.B., "High Fluence Deuteron Bombardment of Silicon" *Radiation Effect* 1977, vol. 32 pp. 159–167.

Klem, J.F., Characteristics of Lift–Off Fabricated AlGaAs/InGaAs Single–Strained–Quantum Well Structures On Glass and Silicon Substrates, *Inst. Phys. Conf. Ser. No. 96: Chapter 6,* pp. 387–392 (1989).

Ligeon, E., "Hydrogen Implantation in Silicon Between 1.5 and 60 KeV" *Radiation Effects* 1976, vol. 27, pp. 129–137.

Manuaba, A., "Comparative Study on $Fe_{32}Nl_{36}Cr_{14}P_{12}B_6$ Metallic Glass and its Polycrystalline Modification bombarded by 2000 keV Helium Ions with High Fluence" *Nuclear Instruments and Methods* 199 (1982) 409–419.

Miyagawa, S., "Helium remission during implantation of silicon carbide" *J. Appl. Phys.* 54 (5), May 1983.

Miyagawa, S., "Surface structure of silicon carbide irradiated with helium ions with monoenergy and continuous energy distributions" *J. Appl. Phys.* 53(12), Dec. 1982, pp. 8697–8705.

Myers, D. R., "The effects of ion–implantation damage on the first–order Raman spectra of GaP" *J. Appl. Phys.* 54(9), Sep. 19??.

Neethling, J.H. et al., Identification of Hydrogen Platelets in Proton–Bombarded GaAs, 1985, pp. 941–945.

Paszli, F., "Flaking and Wave–Like Structure on Metallic Glasses Induced by MeV–Energy Helium Ions" *Nuclear Instruments and Methods* 209/210(1983) 273–280.

Primak, W., "Impurity Effect in the Ionization Dilation of Vitreous Silica" *J. Appl. Phys.* 39(13) 1968.

Roth, J., "Blistering and Bubble Formation" *Inst. Phys. Conf.* Ser. No. 28 © 1976: Chapter 7.

Sah, Chih–Tang et al., "Deactivation of the Boron Acceptor in Silicon by Hydrogen," *Appl. Phys. Lett.* 43(2), Jul. 1983, pp. 204–206.

Snyman, H. C., "Transmission Electron Microscopy of Extended Crystal Defects in Proton Bombarded and Annealed GaAs" *Radiation Effects,* 1983, vol. 69, pp. 199–230.

Snyman, H. C., "Void formation in annealed proton–bombarded GaAs."

Stephan, D., "Investigation of Lattice Strain in Proton–Irradiated GaP by a Modified Auleytner Technique" *phys. stat. sol.* (a) 87, pp. 589–596 (1985).
Tzeng, J.C., "A Novel Self–Aligned Oxygen (Salox) Implanted SOI Mosfet Device Structure" *Nuclear Instruments and Methods in Physics Research* B2, pp. 112–115 (1987).
Wemple, S.H., "Optical and channeling studies of ion–bombarded GaP" *J. Appl. Phys.,* vol. 45, No. 4, Apr. 1974.
CV and Publication of Michael P. Marder faxed Sep. 21, 2000.
Expert Report of Marcus Weldon, Ph.D. dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities in Support of Soitec's Motion for Summary Judgment on Sigen's Enablement Invalidity Claim (Redacted) dated Mar. 27, 2001.
Soitec's Memorandum of Points and Authorities in Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.
Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment As a Matter of Law and a New Trial dated May 10, 2002.
Silicon Genesis Corporation's Opposition to Plaintiff's Motion for Judgment as a Matter of Law and a New Trial dated Jun. 17, 2002.
Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross–Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post–Trial Motions dated Aug. 23, 2002.
Judgment dated Oct. 21, 2002.
Brief of Plaintiffs–Appellants Soitec, S.A. and Commissariat a L'Energie Atomique dated Jan. 28, 2003.
Brief for Defendant–Cross Appellant Silicon Genesis Corporation dated Mar. 22, 2003.
Reply Brief of Plaintiffs–Appellants Soitec, S.A. and Commissariat a L'Energie Atomique dated May 5, 2003.
Reply Brief for Defendant–Cross Appellant Silicon Genesis Corporation dated May 19, 2003.
Order [dated Jan. 7, 2004 denying Appellants' petition for panel rehearing and Appellant's petition for rehearing en banc].
Judgment Mandate [dated Jan. 14, 2004].
Plaintiff/Appellants Supplemental Authority Letter [dated Nov. 17, 2003].
Defendant–Cross Appellant's Response To Appellants' Submission Of *CFMT, Inc.* v. *Yieldup Int'l,* [dated Nov. 24, 2003].
Decision from the United States Court of Appeals for the Federal Circuit dated Nov. 26, 2003.
Combined Petition For Panel Rehearing And For Rehearing En Banc dated Dec. 10, 2003.
Kamada et al., "Observation of Blistering and Amorphization on Germanium Surface After 450 keV Ar+ Ion Bombardment," *Radiation Effects,* 1976, vol. 28, pp. 43–48, Japan Atomic Energy Research Institute, in final form Aug. 18, 1975, Gordon and Breach Science Publishers Ltd. 1976 (printed in Great Britain).
Ono et al., "Orientation Dependence of Flaking of Ion Irradiated Aluminum Single Crystals," *Japanese Journal of Applied Physics,* vol. 25, No. 10, Oct. 1986, pp. 1475–1480.
Wittmaack et al., "High Fluence Retention of Noble Gases Implanted in Silicon," *Radiation Effects,* 1978, vol. 39, pp. 81–95, Gordon and B reach Science Publishers Ltd. 1978 (printed in Great Britain).
Komarov et al. "Crystallographic Nature and Formation Mechanisms of Highly Irregulated Structure in Implanted and Annealed Si Layers," *Radiation Effects,* 1979, vol. 42, pp. 169–177, 1979 Gordon and Breach Science Publishers Inc. 1976 (printed in Holland).
Cerofolini et al., "Hydrogen–Related Complexes as the Stressing Species in High–Fluence, Hydrogen–Implanted, Single–Crystal Silicon," *Physical Review,* vol. 46, No. 4, Jul. 15, 1992–II, 1992 The American Physical Society.
Williams et al., "Application of Ion Beans to Materials, 1975," *Inst. Phys. Conf. Ser. No. 28* © 1976: Chapter 1, pp. 30–36.
Reports of Jean–Pierre Colinge in Response to SiGen Enablement and Indefiniteness Expert Reports of Aug. 24, 2001.
U.S. Appl. No. 09/777,516, also Publication No. US2001–0007789A1 With copy of Allowed Claims, Published Jul. 12, 2001, Aspar et al.
U.S. Appl. No. 10/784,601, Including pending claims, filed Feb. 23, 2004, Aspar et al.
Blöchl, P.E. et al., "First–Principles Calculations of Diffusion Coefficients: Hydrogen in Silicon," *Physical Review Letters,* vol. 64, No. 12, Mar. 19, 1990, pp. 1401–1404.
Canham et al., "Radiative Recombination Channels due to Hydrogren in Crystalline Silicon," *Materials Science and Engineering, B4* (1989), pp. 41–45.
Carter, G. et al., The Collection of Ions Implanted in Semiconductors; II. Range Distributions Derived from Collection and Sputter–Etch Curves, *Radiation Effects,* 1972, vol. 16, pp. 107–114.
Cassidy, Victor M., "Ion Implantation Process Toughens Metalworking Tools," *Modern Metals,* pp. 65–67, 1984.
Chu, P.K. et al., Plasma Immersion Ion Implantation—A Fledgling Technique for Semiconductor Processing, *Materials Science and Engineering Reports: A Review Journal,* pp. 207–280, vol. R17, Nos. 6–7, Nov. 30, 1996.

Chu et al., Radiation Damage of 50–250 keV Hydrogen Ions in Silicon, IBM Systems Products Division, East Fishkill, Hopewell Junction, New York 12533, (undated), pp. 483–492.
Cullis, A.G. , T.E. Seidel and R.L. Meek, "Comparative study of annealed neon–, argon–, and krypton–ion implantation damage in silicon," *J. Appl. Phys.,* 49(10), pp. 5188–5198, Oct. 1978.
Denteneer, P.J.H. et al., Hydrogen Diffusion and Passivation of Shallow Impurities in Crystalline Silicon, Materials Science Forum vols. 38–41 (1989), pp. 979–984, *Trans Tech Publications,* Switzerland.
Denteneer, P.J.H. et al., "Structure and Properties of Hydrogen–Impurity Pairs in Elemental Semiconductors," *Physical Review Letters,* vol. 62, No. 16, Apr. 17, 1989, pp. 1884–1888.
Grovenor, C.R.M., Microelectronic Materials, pp. 73–75 (1989).
Haisma et al., Silicon–on–Insulator Wafer Bonding–Wafer Thinning Technological Evaluations, *Japanese Journal of Applied Physics,* 28(1989), Aug., No. 8, Part 1, Tokyo, Japan, pp. 1426–1443.
Hamaguchi et al., Device Layer Transfer Technique using Chemi–Mechanical Polishing, *Japanese Journal of Applied Physics,* 23(1984), Oct., No. 10, Part 2, Tokyo, Japan, pp. L815–L817.
Hulett, D.M. et al., "Ion Nitriding and Ion Implantation: A Comparison," *Metal Progress,* pp. 18–21, Aug. 1985.
"Isolation by Inert Ion Implantation" *IBM Technical Disclosure Bulletin* vol. 29, No. 3, Aug. 1986, p. 1416.
Li, J., "Novel Semiconductor Substrate Formed by Hydrogen Ion Implantation into Silicon," *Appl. Phys. Lett.,* vol. 55, No. 21, pp. 2223–2224, Nov. 20, 1989.
Matsuda et al., "Large Diameter Ion Beam Implantation System," Nuclear Instruments and Methods, vol. B21, pp. 314–316, 1987.
Mishima, Y. and T. Yagishita, T. "Investigation of the bubble formation mechanism in a–Si:H films by Fourier–transform infrared mirospectroscopy" *J. Appl. Phys.,* vol. 64, No. 8, Oct. 15, 1988.
Monemar, B. (editor), "Shallow Impurities in Semiconductors 1988," Proceedings of the Third International Conference in Linköping, Sweden, Aug. 10–12, 1988, Institute of Physics Conference Series No. 95, Institute of Physics, Bristol and Philadelphia, pp. 493–499.
Moreau, Wayne M., "Semiconductor Lithography, Principles, Practices, and Materials," Plenum Press, 1988. Table of Contents only.
Moriceau, H. et al, A New Characterization Process Used to Qualify SOI Films 1991 pp. 173–178.
Nichols, C.S. et al., "Properties of Hydrogen in Crystalline Silicon Under Compression and Tension," *Physical Review Letters,* vol. 63, No. 10, Sep. 4, 1989, pp. 1090–1093.
Picraux, S. Thomas et al., "Ion Implantation of Surfaces," *Scientific American,* vol. 252, No. 3, pp. 102–113 1985.
Renier, M. et al., "A New Low–Engergy Ion Implanter for Bombardment of Cylindrical Surfaces," Vacuum, vol. 35, No. 12, pp. 577–578, 1985.
Saint–Jacques, R.G., "La Formation des Cloques," Nuclear Instruments and Methods 209/210 (1983), pp. 333–343, North–Holland Publishing Company.
Sioshansi, Piran, "Ion Beam Modification of Materials for Industry," Thin Solid Film, vol. 118, pp. 61–71, 1984.
Sze, S.M., VLSI Technology, 2.sup.nd Ed., pp. 9–10 (1988), McGraw Hill.
U.S. Dept. of Energy, "Fusion Connection: Contributions to Industry, Defense, and Basic Science Resulting From Scientific Advances Made in the Magnetic Fusion Energy Program," *Plasma Coating,* pp. 6–7, Oct. 1985.
Van Swijgenhoven, et al., "Helium Bubble and Blister Formation for Nickel and An Amorphous Fe–Ni–Mo–B Alloy During 5 keV He+–Irradiation at Temperatures Between 200 K and 600 K," Nuclear Instruments and Methods 209/210 (1983) pp. 461–468, North Holland Publishing Company.
Van de Walle, C.G., "Structural Identification of Hydrogen and Muonium Centers in Silicon: First–Principles Calculations of Hyperfine Parameters," *Physical Review Letters,* vol. 64, No. 6, Feb. 5, 1980, pp. 669–672.
Van de Walle, C.G. et al., "Theory of Hydrogen Diffusion and Reactions in Crystalline Silicon," *Physical Review Letters,* vol. 60, No. 26, Jun. 27, 1988, pp. 2761–2764.
Van de Walle, C.G. et al., "Theory of Hydrogen Diffusion and Reactions in Crystalline Silicon," *Physical Review B,* vol. 39, No. 15, May 15, 1989, pp. 10 791–10 808, plus diagrams.
Van de Walle, Chris G., "Theoretical Aspects of Hydrogen in Crystalline Semiconductors," *Physica B,* 170 (1991), pp. 21–32, North–Holland.
Veldkamp, W.B. et al., "Binary Optics," *Scientific American,* pp. 50–55, May 1992.
Whitton, J.L. et al., "The Collection of Ions Implanted in Semiconductors: I. Saturation Effects," *Radiation Effects,* 1972, vol. 16, pp. 101–105, Gordon and Breach, Science Publishers Ltd., Glasgow, Scotland.
Wolf, Stanley Ph.D., Silicon Processing for the VLSI Era (vol. 2), pp. 66–79, Lattice Press, 1990.
Expert Report of Jean–Pierre Colinge dated Nov. 1, 2000.
Cowern, N.E.B., et al., "Transport Diffusion Of Ion–Implanted B In Si: Dose, Time, and Matrix Dependence of Atomic and Electrical Profiles," *J. Appl. Phys* 68 (12), Dec. 15, 1990, pp. 6191–6198.
Csepregl, L. et al., "Regrowth Behavior of Ion–Implanted Amorphous Layers on <111> Silicon," *Applied Physics Letters,* 2, Jul. 15, 1976, pp. 92–93.
Cullis, A.G., et al., "Comparative Study of Annealed Neon–, Argon–, and Krypton– Ion Implantation Damage in Silicon," *J. Appl. Phys.,* 49(10), pp. 5188–5198, Oct. 1978.
Ghandi, Sorab K., "VLSI Fabrication Principles—Silicon and Gallium Arsenide," *Rensselaer Polytechnic Institute,* 1983, John Wiley & Sons, Inc., pp. 135.
Jaussaud, C., et al., "Microstructure of Silicon Implanted With High Dose Oxygen Ions," *Appl. Phys. Lett.* 48(11), Jun. 1, 1985, pp. 1064–1066.
Jones, K.S., et al., "A Systematic Analysis of Defects in Ion Implanted Silicon," *Applied Physics* A, 45, 1–34, 1988.
"Applied Physics Letter," vol. 55. No. 21, Nov. 20, 1989, pp. 2223–2224.*
"IBM Technical Disclosure Bulletin, " vol. 29, No. 3, Aug., 1986, p. 1416.*

* cited by examiner

PROCESS FOR THE PRODUCTION OF THIN SEMICONDUCTOR MATERIAL FILMS

Matter enclosed in heavy brackets [ ] appears in the original patent but forms no part of this reissue specification; matter printed in italics indicates the additions made by reissue.

BACKGROUND OF THE INVENTION

The present invention relates to a process for the production of thin semiconductor material films, preferably applicable to the production of monocrystalline films.

It is known that for producing monocrystalline semiconductor films there are various methods and processes, which are often complex and expensive to carry out, because although it is relatively easy to produce polycrystalline or amorphous material films, it is much more difficult to produce monocrystalline films.

Among the methods used for producing monocrystalline films are those used for producing socalled "silicon on insulator" substrates, where the aim is to produce a monocrystalline silicon film resting on a substrate electrically insulated from the film.

By crystal growth heteroepitaxy methods make it possible to grow an e.g. thin film silicon crystal on a monocrystalline substrate of another type, whose lattice parameter is close to that of silicon, e.g. a sapphire substrate ($Al_2O_3$) or calcium fluoride substrate ($CaF_2$). (cf. ref. 5) (identified below).

The SIMOX process (name used in the literature) makes use of high oxygen dose ion implantation in a silicon substrate for creating in the silicon volume a silicon oxide layer separating a monocrystalline silicon film from the substrate mass (cf. ref. 1).

Other processes make use of the principle of thinning a wafer by chemical or mechanochemical abrasion. The most successful of the processes in this category also use the etch-stop principle, which makes it possible to stop the thinning of the wafer as soon as the requisite thickness is reached and in this way it is possible to ensure a uniformity of thickness. This procedure e.g. consists of p-type doping of the n-type substrate over the thickness of the film which it is wished to obtain and then chemically etching the substrate with a chemical bath active for the n-type silicon and inactive for the p-type silicon (cf. refs. 2 and 3).

The main applications of monocrystalline semiconductor films are silicon on insulator substrates, self-supporting silicon or silicon carbide membranes or diaphragms for producing X-ray lithography masks, sensors, solar cells and the production of integrated circuits with several active layers.

The various methods for producing thin monocrystalline films suffer from the disadvantages associated with the production procedures.

Heteroepitaxy methods are limited by the nature of the substrate, because the lattice parameter of the substrate is not precisely the same as that of the semiconductor, the film having numerous crystal defects. In addition, these substrates are expensive and fragile and only exist with limited dimensions.

The SIMOX method requires a very high dose ion implantation requiring a very heavy and complex implantation machine. The output of such machines is limited and it would be difficult to significantly increase it.

Thinning methods are not competitive from the uniformity and quality standpoints except when using the etch-stop principle. Unfortunately, the creation of said etch-stop makes the process complex and in certain cases can limit the use of the film. Thus, if the etch-stop is produced by p-type doping in a n-type substrate, any electronic devices produced in the film would have to adapt to the p-type nature of the films.

SUMMARY OF THE INVENTION

The present invention relates to a process for producing thin semiconductor material films making it possible to overcome the aforementioned disadvantages without requiring an initial substrate of a different nature from that of the chosen semiconductor, without requiring very high implantation doses, or an etch-stop, but which still makes it possible to obtain a film having a uniform, controlled thickness.

This process for the preparation of thin films is characterized in that it comprises subjecting a semiconductor material wafer having a planar face and whose plane is either substantially parallel to a principle crystallographic plane in the case where the semiconductor material is perfectly monocrystalline, or slightly inclined with respect to the principle crystallographic plane of the same indices for all the grains, in the case wherein the material is polycrystalline, to the three following stages:

a first stage of implantation by bombardment (2) of the face (4) of said wafer (1) by means of ions creating in the volume of said wafer at a depth close to the average penetration depth of the said ions, a layer (3) of gaseous microbubbles defining in the volume of said wafer a lower region (6) constituting the mass of the substrate and an upper region (5) constituting the thin film, the ions being chosen from among hydrogen gas or rare gas ions and the temperature of the wafer during implantation being kept below the temperature at which the gas produced by the implanted ions can escape from the semiconductor by diffusion, a second stage of intimately contacting the planar face (4) of said wafer with a stiffener (7) constituted by at least one rigid material layer, a third stage of thermally treating the assembly of said wafer (1) and said stiffener (7) at a temperature above that at which ion bombardment (2) takes place and adequate to create by a crystalline rearrangement effect in the wafer (1) and a pressure effect in the microbubbles, a separation between the thin film (5) and the mass of the substrate (6), the stiffener and the planar face of the wafer being kept in intimate contact during said stage.

Thus, the invention also applies to a polycrystalline semiconductor material, provided that the grains constituting the latter all have a principle crystallographic plane (said plane having the same indices, e.g. 1,0,0 for all the semiconductor grains) substantially parallel to the semiconductor surface. With respect to the semiconductor materials reference can be made to ZMRSOI (ZMR=Zone–Melting–Recrystallization) (cf. ref. 4). The term implantation stage is understood to mean both a single implantation stage and a succession of implantations at different does and/or different energies and/or with different ions.

According to a variant of the process according to the invention, it can be advantageous to carry out ion implantation in a semiconductor material through one or more layers of materials, said "encapsulating" layers being chosen in such a way that the ions traverse the same and penetrate the semiconductor. For example, the encapsulating layers can be used as means for reducing the penetration of ions in the semiconductor for producing finer membranes or as a means for protecting the semiconductor from possible contamination, or as a means for controlling the physiochemical state of the semiconductor surface. When the substrate constituting the wafer is made from silicon, it can be advantageous to choose an encapsulating layer constituted by thermal silicon oxide with a thickness e.g. between 25 and 500 nm. These encapsulating layers can be retained or removed following the implantation state.

According to the invention, the temperature of the wafer on which ion implantation takes place is controlled throughout the operation, so that it remains below the critical temperature at which the gas produced by the implanted ion diffuses rapidly and escapes from the semiconductor. For example, said critical temperature is approximately 500° C. for hydrogen implantation in silicon. Above said temperature, the process becomes ineffective due to the absence of microbubble formation. In the case of silicon, preference is given to an implantation temperature between 20° and 450° C.

During the third stage of the heat treatment of the wafer-stiffener assembly, there is a crystalline rearrangement following the disorder created by the ion implantation. The separation between the film and the substrate is due both to the crystalline rearrangement and to the coalescence of the bubbles, which produce microbubbles, both resulting from the third stage heat treatment. Under the effect of the pressure of the gas within these bubbles, the semiconductor surface is subject to high stresses. If it is wished to avoid a surface deformation and the formation of blisters corresponding to the macrobubbles formed, it is vital to compensate these stresses. Thus, the blisters can shatter before the macrobubbles have reached their final growth stage and have coalesced with one another. Therefore if it is wished to obtain a continuous semiconductor film, it is necessary to compensate the stresses appearing during the heat treatment phase. According to the invention, this compensation is brought about by the intimate contacting of the semiconductor wafer surface and a stiffener. The function of the stiffener is that is contact with the surface and its mechanical properties will lead to a compensation of the stresses produced by the macrobubbles. Therefore the semiconductor film can remain flat and intact throughout the heat treatment phase and up to the final cleaving.

According to the invention, the choice of the production method for said stiffener and its nature are a function of each envisaged application for the said film. For example, if the intended application is the production of a silicon on insulator substrate, the stiffener can advantageously be constituted by a silicon wafer covered by at least one dielectric layer, such as an oxide or a nitride layer, the dielectric of the stiffener being intimately contacted with the wafer from which the film is to be produced, the wafer optionally having or not having an e.g. silicon oxide encapsulating layer.

The stiffener can either be joined to the wafer, or can be produced thereon with the aid of methods such as evaporation, atomization, chemical vapor deposition, which may or may not be plasma or photon-assisted, if the thickness chosen for the stiffener is of a moderate nature, i.e. a few micrometers to a few dozen micrometers.

The term intimate contact is understood to mean a contact obtained by pressing the stiffener onto the wafer, e.g. by electrostatic pressure and/or by an adherent contact.

Thus, according to the invention, said same stiffener can also be bonded to the semiconductor wafer either by an adhesive substance both to the stiffener and to the wafer, or, if it is not desired to use an adhesive substance, by the effect of a prior preparation of at least one of the surfaces to be bonded and a thermal and/or electrostatic treatment, optionally with a choice of pressures in order to assist the interatomic bonds between the stiffener and the semiconductor wafer. The stiffener can also be applied to the wafer by an electrostatic pressure.

For applications concerning the production of self-supporting diaphragms and membranes, it is appropriate to choose the nature of the stiffener such that it is easily and selectively possible to separate the stiffener from the film. For information purposes, in order to produce a monocrystalline silicon diaphragm, it is e.g. possible to choose a silicon oxide stiffener, which is then eliminated in a hydrofluoric acid bath following the third thermal stage of the process.

According to a feature of the process according to the invention, the choice of the performance temperatures for the second and third stages must comply with the following requirements. The installation of the stiffener on the wafer must not lead to the application thereto of a temperature, which might trigger the third stage procedures. For this reason, it is necessary according to the invention to carry out the second stage of the process at a temperature below that of the heat treatment of the third stage. This heat treatment must, according to the invention, be carried out at a temperature at which the crystalline rearrangement and coalescence of the bubbles can effectively take place. For example, in the case of silicon, a temperature above approximately 500° C. is necessary to enable the crystalline rearrangement and coalescence of the bubbles to take place with adequate kinetics.

In the performance of the process according to the invention, the ions used for implantation by bombardment are usually H+ ions, but this choice must not be looked upon as limitative. Thus, the principle of the method is applicable with molecules hydrogen ions or with ions of rare gases such as helium, neon, krypton and xenon, used either singly or in combination. For industrial applications of the process according to the invention, preference is given to group IV semiconductors and it is e.g. possible to use silicon, germanium, silicon carbide and silicon-germanium alloys.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

The embodiment which will now be described in conjunction with the above drawings relates to the production of a thin film in a monocrystalline silicon wafer with the aid of H+ ion implantations.

Figure 1:
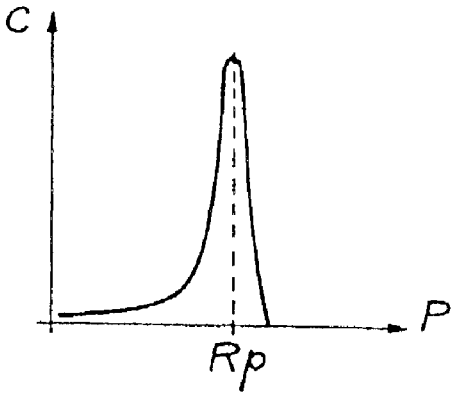
FIG. 1 The concentration profile of the hydrogen ions as a function of the penetration depth.

The implantation of H+ ions (protons) at 150 keV in a monocrystalline silicon wafer, whose surface corresponds to a principle crystallographic plane, e.g. a 1,0,0 plane lead, in the case of weak implantation doses ($<10^{16}$ $cm^{-2}$) to a hydrogen concentration profile C as a function of the depth P having a concentration maximum for a depth Rp, as shown in FIG. 1. In the case of a proton implantation in silicon, Rp is approximately 1.25 micrometers.

For doses of approximately $10^{16}$ $cm^{-2}$, the implanted hydrogen atoms start to form bubbles, which are distributed in the vicinity of a plane parallel to the surface. The plane of the surface corresponds to a principal crystallographic plane and the same applies with respect to the plane of the microbubbles, which is consequently a cleaving plane.

For an implanted dose of $>10^{16}$ $cm^{-2}$ (e.g. $5\cdot10^{16}$ $cm^{2}$), it is possible to thermally trigger the coalescence between the bubbles inducing a cleaving into two parts of the silicon, an upper 1.2 micrometer thick film (the thin film) and the mass of the substrate.

Hydrogen implantation is an advantageous example, because the braking process of said ion in silicon is essentially ionization (electronic braking), the braking of the nuclear type with atomic displacements only occurring at the end of the range. This is why very few defects are created in the surface layer of the silicon and the bubbles are concentrated in the vicinity of the depth Rp (depth of the concentration maximum) over a limited thickness. This makes it possible to obtain the necessary efficiency of the method for moderate implanted doses ($5\cdot10^{6}$ $cm^{-2}$) and, following the separation of the surface layer, a surface having a limited roughness.

The use of the process according to the invention makes it possible to choose the thickness of the thin film within a wide thickness range by choosing the implantation energy. This property is all the more important as the implanted ion has a low atomic number z. For example, the following table gives the thickness of the film which can be obtained for different implantation energies of $H^+$ ions (z=1).

| Energy of $H^+$ ions in keV | 10 | 50 | 100 | 150 | 200 | 500 | 1000 |
|---|---|---|---|---|---|---|---|
| Thickness of the film in μm | 0.1 | 0.5 | 0.9 | 1.2 | 1.6 | 4.7 | 13.5 |

Figure 2:
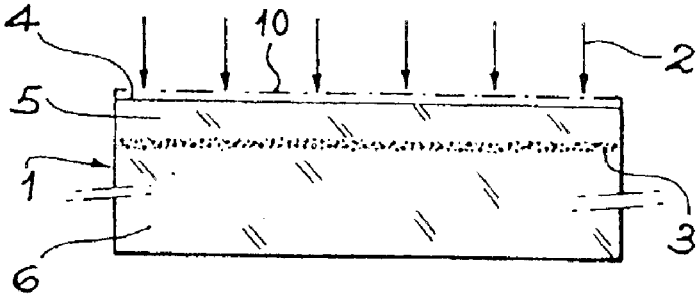
FIG. 2 The monocrystalline semiconductor wafer used in the invention as the origin of the monocrystalline film, in section, exposed to a bombardment of H+ ions and within which has appeared a gas microbubble layer produced by the implanted particles.

FIG. 2 shows the semiconductor wafer I optionally covered with an encapsulating layer 10 subject to an ion bombardment 2 of H+ ions through the planar face 4, which is parallel to a principal crystallographic plane. It is possible to see the microbubble layer 3 parallel to the face 4. The layer 3 and the face 4 define the thin film 5. The remainder of the semiconductor substrate 6 constitutes the mass of the substrate.

Figure 3:
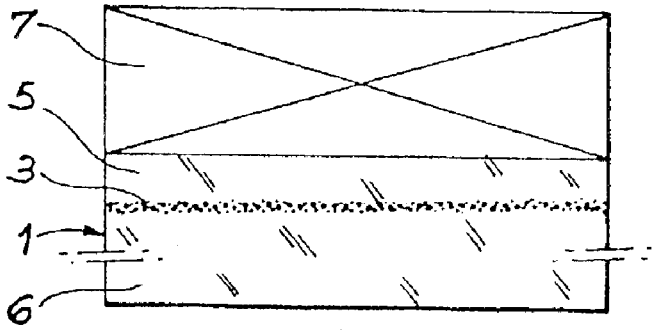
FIG. 3 The semiconductor wafer shown in FIG. 2 and covered with a stiffener.

FIG. 3 shows the stiffener 7 which is brought into intimate contact with the face 4 of the semiconductor wafer 1. In an interesting embodiment of the invention, ion implantation in the material takes place through a thermal silicon oxide encapsulating layer 10 and the stiffener 7 is constituted by a silicon wafer covered by at least one dielectric layer.

Another embodiment uses an electrostatic pressure for fixing the stiffener to the semiconductor material. In this case, a silicon stiffener is chosen having an e.g. 5000 Å thick silicon oxide layer. The planar face of the wafer is brought into contact with the oxide of the stiffener and between the wafer and the stiffener is applied a potential difference of several dozen volts. The pressures obtained are then a few $10^5$ to $10^6$ Pascal.

Figure 4:
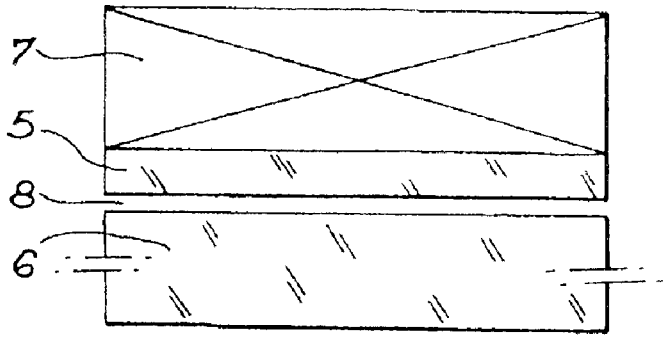
FIG. 4 The assembly of the semiconductor wafer and the stiffener shown in FIG. 3 at the end of the heat treatment phase, when cleaving has take place between the film and the substrate mass.

FIG. 4 shows the film 5 joined to the stiffener 7 separated by the space 8 from the mass of the substrate 6.

The present text refers to the following documents:

(1) SIMOX OI for Integrated Circuit Fabrication by Hon Wai Lam, IEEE Circuits and Devices Magazine, July 1987.

(2) Silicon on Insulator Wafer Bonding, Wafer Thinning, Technological Evaluations by Haisma, Spierings, Bierman et Pals, Japanese Journal of Applied Physics, vol. 28, no. 8, August 1989.

(3) Bonding of silicon wafers for silicon on insulator by Maszara, Goetz, Caviglia and McKitterick, Journal of Applied Physics 64 (10) 15 November 1988.

(4) Zone melting recrystallization silicon on insulator technology by Bor Yeu Tsaur, IEEE Circuits and Devices Magazine, July 1987.

(5) 1986 IEEE SOS/SOI Technology Workshop, Sep. 30–Oct. 2, 1986, South Seas plantation resort and yacht Harbour, Captiva Island, Fla.

I claim:

1. Process for the preparation of thin semiconductor material films, wherein the process comprises subjecting a semiconductor material wafer having a planar face and whose plane[.] is substantially parallel to a principal crystallographic plane, to the three following stages:

a first stage of implantation by ion bombardment of the face of said wafer by means of ions creating in the volume of said wafer at a depth close to the average penetration depth of said ions, a layer of gaseous microbubbles defining in the volume of said wafer a lower region constituting a majority of the substrate and an upper region constituting the thin *semiconductor material* film, the ions being [chosen from among] hydrogen gas ions [or rare gas ions] and, *wherein* the temperature of the wafer during implantation [being] *is* kept below the temperature at which the gas produced by the implanted ions can escape from the semiconductor by diffusion, a second stage of intimately contacting the planar face of said wafer with a stiffener constituted by at least one rigid material layer, a third stage of thermally treating the assembly of said wafer and said stiffener at a temperature above that at which the ion bombardment takes place and adequate to create by a crystalline rearrangement effect in the wafer, *a coalescence of hydrogen microbubbles* and a pressure effect in the *hydrogen* microbubbles, a separation between the thin *semiconductor material* film and the majority of the substrate, the stiffener and the planar face of the wafer being kept in intimate contact during said stage.

2. Process for the preparation of thin *semiconductor material* films according to claim 1, wherein the stage of implanting ions in the semiconductor material takes place through one or more layers of materials having a nature and thickness such that they can be traversed by the ions.

3. Process for the [production] *preparation* of thin *semiconductor material* films according to claim 1, wherein the semiconductor comprises a group IV material.

4. Process for the [production] *preparation* of thin *semiconductor material* films [according to claim 1], wherein the *process comprises subjecting a* semiconductor [is] *material wafer of* silicon[.] *having a planar face and whose plane is substantially parallel to a principal crystallographic plane, to the three following stages:*

*a first stage of implantation by ion bombardment of the face of said wafer by means of ions creating in the*

*volume of said wafer at a depth close to the average penetration depth of said ions, a layer of gaseous microbubbles defining in the volume of said wafer a lower region constituting a majority of the substrate and an upper region constituting the thin semiconductor material film, wherein* the implanted [ion is a] *ions are* hydrogen gas [ion,] *ions and* the wafer temperature during implantation is *kept below the temperature at which the gas produced by the implanted ions can escape from the semiconductor by diffusion and* between 20° and 450° C., [and]

*a second stage of intimately contacting the planar face of said wafer with a stiffener constituted by at least one rigid material layer, and*

*a third stage of thermally treating the assembly of said wafer and said stiffener at a temperature above that at which the ion bombardment takes place and adequate to create by a crystalline rearrangement effect in the wafer and a pressure effect in the microbubbles, a separation between the thin semiconductor material film and the majority of the substrate, the stiffener and the planar face of the wafer being kept in intimate contact during said stage,*

*wherein* the temperature of the third heat treatment stage exceeds 500° C.

5. Process for the [production] *preparation* of thin *semiconductor material* films according to claim 2, wherein implantation takes place through an encapsulating thermal silicon oxide layer and the stiffener is a silicon wafer covered by at least one silicon oxide layer.

6. Process for the [production] *preparation* of thin *semiconductor material* films according to claim 1, wherein the second stage of intimately contacting the planar face of said wafer with a stiffener takes place by applying an electrostatic pressure.

7. Process for the [production] *preparation* of thin *semiconductor material* films according to claim 1, wherein the stiffener is deposited by one or more methods from within the group consisting of evaporation, sputtering, and chemical vapor deposition with or without plasma assistance or photon assistance.

8. Process for the [production] *preparation* of thin *semiconductor material* films according to claim 1, wherein the stiffener is bonded to said wafer by means of an adhesive substrate.

9. Process for the [production] *preparation* of thin *semiconductor material* films according to claim 1, wherein the stiffener is made to adhere to the wafer by a treatment favoring interatomic bonds.

*10. Process for the preparation of thin semiconductor material films according to claim 1 further comprising cleaving the thin semiconductor material film from the substrate.*

*11. Process for the preparation of thin semiconductor material films according to claim 1, wherein the thin semiconductor material films are formed as a continuous film of semiconductor material.*

*12. Process for the preparation of thin semiconductor material films according to claim 1, wherein the semiconductor material wafer comprises silicon.*

*13. Process for the preparation of thin semiconductor material films according to claim 1, wherein the semiconductor material wafer comprises germanium.*

*14. Process for the preparation of thin semiconductor material films according to claim 1, wherein the semiconductor material wafer comprises a silicon-germanium alloy.*

*15. Process for the preparation of thin semiconductor material films according to claim 1, wherein the semiconductor material wafer comprises silicon carbide.*

*16. Process for the preparation of thin semiconductor material films according to claim 1, wherein the stiffener comprises a silicon wafer covered by at least one silicon oxide layer.*

*17. Process for the preparation of thin semiconductor material films, wherein the process comprises subjecting a semiconductor material wafer having a planar face and whose plane is substantially parallel to a principal crystallographic plane, to the three following stages:*

*a first stage of implantation by hydrogen ion bombardment of the face of said wafer by means of hydrogen ions creating in the volume of said wafer at a depth close to the average penetration depth of said ions, a layer of gaseous microbubbles defining in the volume of said wafer a lower region constituting a majority of the substrate and an upper region constituting the thin semiconductor material film, wherein the temperature of the wafer during implantation is kept below the temperature at which the gas produced by the implanted ions can escape from the semiconductor by diffusion,*

*a second stage of intimately contacting the planar face of said wafer with a stiffener constituted by at least one rigid material layer,*

*a third stage of thermally treating the assembly of said wafer and said stiffener at a temperature above that at which the ion bombardment takes place and adequate to create by a crystalline rearrangement effect in the wafer, a coalescence of hydrogen microbubbles and a pressure effect in the hydrogen microbubbles, a separation between the thin semiconductor material film and the majority of the substrate, the stiffener and the planar face of the wafer being kept in intimate contact during said stage.*

*18. Process for the preparation of thin semiconductor material films according to claim 17, wherein the stage of implanting ions in the semiconductor material takes place through one or more layers of materials having a nature and thickness such that they can be traversed by the ions.*

*19. Process for the preparation of thin semiconductor material films according to claim 17, wherein the semiconductor material comprises a group IV semiconductor.*

*20. Process for the preparation of thin semiconductor material films according to claim 17, wherein the semiconductor material wafer comprises silicon.*

*21. Process for the preparation of thin semiconductor material films according to claim 17, wherein the semiconductor material wafer comprises germanium.*

*22. Process for the preparation of thin semiconductor material films according to claim 17, wherein the semiconductor material wafer comprises a silicon-germanium alloy.*

*23. Process for the preparation of thin semiconductor material films according to claim 17, wherein the semiconductor material wafer comprises silicon carbide.*

*24. Process for the preparation of thin semiconductor material films according to claim 17, wherein implantation takes place through an encapsulating thermal silicon oxide layer.*

*25. Process for the preparation of thin semiconductor material films according to claim 17, wherein the stiffener comprises a silicon wafer covered by at least one silicon oxide layer.*

*26. Process for the preparation of thin semiconductor material films according to claim 17, wherein the second stage of intimately contacting the planar face of said wafer with a stiffener takes place by applying an electrostatic pressure.*

*27. Process for the preparation of thin semiconductor material films according to claim 17, wherein the stiffener is deposited by one or more methods from within the group consisting of evaporation, sputtering, and chemical vapor deposition with or without plasma assistance or photon assistance.*

*28. Process for the preparation of thin semiconductor material films according to claim 17, wherein the stiffener is bonded to said wafer by means of an adhesive substance.*

*29. Process for the preparation of thin semiconductor material films according to claim 17, wherein the stiffener is made to adhere to the wafer by a treatment favoring interatomic bonds.*

*30. Process for the preparation of thin semiconductor material films according to claim 17, which further comprises cleaving the thin semiconductor material film from the substrate.*

*31. Process for the preparation of thin films according to claim 17, wherein the thin semiconductor material films are formed as a continuous film of semiconductor material.*

*32. Process for the preparation of thin semiconductor material films, wherein the process comprises subjecting a semiconductor material wafer having a planar face and whose plane is substantially parallel to a principal crystallographic plane, to the three following stages:*

*a first stage of implantation by ion bombardment of the face of said wafer by means of ions creating in the volume of said wafer at a depth close to the average penetration depth of said ions, a layer of gaseous microbubbles defining in the volume of said wafer a lower region constituting a majority of the substrate and an upper region constituting the thin semiconductor material film, the ions consisting of hydrogen gas ions and, wherein the temperature of the wafer during implantation is kept below the temperature at which the gas produced by the implanted ions can escape from the semiconductor by diffusion,*

*a second stage of intimately contacting the planar face of said wafer with a stiffener constituted by at least one rigid material layer,*

*a third stage of thermally treating the assembly of said wafer and said stiffener at a temperature above that at which the ion bombardment takes place and adequate to create by a crystalline rearrangement effect in the wafer, a coalescence of hydrogen microbubbles and a pressure effect in the hydrogen microbubbles, a separation between the thin semiconductor material film and the majority of the substrate, the stiffener and the planar face of the wafer being kept in intimate contact during said stage.*

*33. Process for the preparation of thin semiconductor material films according to claim 32, wherein the stage of implanting ions in the semiconductor material takes place through one or more layers of materials having a nature and thickness such that they can be traversed by the ions.*

*34. Process for the preparation of thin semiconductor material films according to claim 32, wherein the semiconductor material comprises a group IV semiconductor.*

*35. Process for the preparation of thin semiconductor material films according to claim 32, wherein the semiconductor material wafer comrises silicon.*

*36. Process for the preparation of thin semiconductor material films according to claim 32, wherein the semiconductor material wafer comrises germanium.*

*37. Process for the preparation of thin semiconductor material films according to claim 32, wherein the semiconductor material wafer comrises a silicon-germanium alloy.*

*38. Process for the preparation of thin semiconductor material films according to claim 32, wherein the semiconductor material wafer comrises silicon carbide.*

*39. Process for the preparation of thin semiconductor material films according to claim 32, wherein implantation takes place through an encapsulating thermal silicon oxide layer.*

*40. Process for the preparation of thin semiconductor material films according to claim 32, wherein the stiffener comprises a silicon wafer covered by at least one silicon oxide layer.*

*41. Process for the preparation of thin semiconductor material films according to claim 32, wherein the second stage of intimately contacting the planar face of said wafer with a stiffener takes place by applying an electrostatic pressure.*

*42. Process for the preparation of thin semiconductor material films according to claim 32, wherein the stiffener is deposited by one or more methods from within the group consisting of evaporation, sputtering, and chemical vapor deposition with or without plasma assistance or photon assistance.*

*43. Process for the preparation of thin semiconductor material films according to claim 32, wherein the stiffener is bonded to said wafer by means of an adhesive substance.*

*44. Process for the preparation of thin semiconductor material films according to claim 32, wherein the stiffener is made to adhere to the wafer by a treatment favoring interatomic bonds.*

*45. Process for the preparation of thin semiconductor material films according to claim 32, which further comprises cleaving the thin semiconductor material film from the substrate.*

*46. Process for the preparation of thin films according to claim 32, wherein the thin semiconductor material film is formed as a continuous film of semiconductor material.*

*47. Process for the preparation of thin semiconductor material films, wherein the process comprises subjecting a semiconductor material wafer having a planar face and whose plane is substantially parallel to a principal crystallographic plane, to the three following stages:*

*a first stage of implantation by hydrogen ion bombardment of the face of said wafer so as to create in the volume of said wafer at a depth close to the average penetration depth of said ions, a layer of gaseous hydrogen microbubbles defining in the volume of said wafer a lower region constituting a majority of the substrate and an upper region constituting the thin semiconductor material film, wherein the temperature of the wafer during implantation is kept below the temperature at which the gas produced by the implanted ions can escape from the semiconductor by diffusion;*

*a second stage of intimately contacting the planar face of said wafer with a stiffener constituted by at least one rigid material layer, and*

*a third stage of thermally treating the assembly of said wafer and said stiffener at a temperature above that at which the ion bombardment takes place and adequate to create by a crystalline rearrangement effect in the wafer and a pressure effect in the microbubbles, a separation between the thin semiconductor material film and the majority of the substrate, the stiffener and the planar face of the wafer being kept in intimate contact during said stage.*

*48. Process for the preparation of thin semiconductor material films according to claim 47, wherein the stage of*

*implanting ions in the semiconductor material takes place through one or more layers of materials having a nature and thickness such that they can be traversed by the ions.*

*49. Process for the preparation of thin semiconductor material films according to claim 47, wherein the semiconductor material comprises a group IV semiconductor.*

*50. Process for the preparation of thin semiconductor material films according to claim 47, wherein the semiconductor material wafer comprises silicon.*

*51. Process for the preparation of thin semiconductor material films according to claim 47, wherein the semiconductor material wafer comprises germanium.*

*52. Process for the preparation of thin semiconductor material films according to claim 47, wherein the semiconductor material wafer comprises a silicon-germanium alloy.*

*53. Process for the preparation of thin semiconductor material films according to claim 47, wherein the semiconductor material wafer comprises silicon carbide.*

*54. Process for the preparation of thin semiconductor material films according to claim 47, wherein implantation takes place through an encapsulating thermal silicon oxide layer.*

*55. Process for the preparation of thin semiconductor material films according to claim 47, wherein the stiffener comprises a silicon wafer covered by at least one silicon oxide layer.*

*56. Process for the preparation of thin semiconductor material films according to claim 47, wherein the second stage of intimately contacting the planar face of said wafer with a stiffener takes place by applying an electrostatic pressure.*

*57. Process for the preparation of thin semiconductor material films according to claim 47, wherein the stiffener is deposited by one or more methods from within the group consisting of evaporation, sputtering, and chemical vapor deposition with or without plasma assistance or photon assistance.*

*58. Process for the preparation of thin semiconductor material films according to claim 47, wherein the stiffener is bonded to said wafer by means of an adhesive substance.*

*59. Process for the preparation of thin semiconductor material films according to claim 47, wherein the stiffener is made to adhere to the wafer by a treatment favoring interatomic bonds.*

*60. Process for the preparation of thin semiconductor material films according to claim 47, which further comprises cleaving the thin semiconductor material film from the substrate.*

*61. Process for the preparation of thin films according to claim 47, wherein the thin semiconductor material film is formed as a continuous film of semiconductor material.*

*62. Process for the preparation of thin semiconductor material films, wherein the process comprises subjecting a semiconductor material wafer having a planar face and whose plane is substantially parallel to a principal crystallographic plane, to the three following stages:*

*a first stage of implantation by ion bombardment of the face of said wafer by means of hydrogen ions creating, by electronic braking in the wafer, in the volume of said wafer at a depth close to the average penetration depth of said ions, a layer of gaseous hydrogen microbubbles defining in the volume of said wafer a lower region constituting a majority of the substrate and an upper region constituting the thin semiconductor material film, wherein the temperature of the wafer during implantation is kept below the temperature at which the gas produced by the implanted ions can escape from the semiconductor by diffusion;*

*a second stage of intimately contacting the planar face of said wafer with a stiffener constituted by at least one rigid material layer,*

*a third stage of thermally treating the assembly of said wafer and said stiffener at a temperature above that at which the ion bombardment takes place and adequate to create by a crystalline rearrangement effect in the wafer and a coalescence of hydrogen microbubbles and a pressure effect in the hydrogen microbubbles, a separation between the thin semiconductor material film and the majority of the substrate, the stiffener and the planar face of the wafer being kept in intimate contact during said stage.*

*63. Process for the preparation of thin semiconductor material films according to claim 62, which further comprises cleaving the thin semiconductor material film from the substrate.*

*64. Process for the preparation of thin semiconductor material films according to claim 62, wherein the semiconductor material comprises silicon.*

*65. Process for the preparation of thin semiconductor material films according to claim 64, wherein the thickness of the thin semiconductor material film increases with increasing hydrogen implantation energy.*

*66. Process for the preparation of thin semiconductor material films according to claim 65, wherein the implantation takes place through a layer of thermal silicon oxide layer.*

*67. Process for the preparation of thin semiconductor material films according to claim 62, wherein the semiconductor material wafer comprises a monocrystalline silicon wafer.*

*68. Process for the preparation of thin semiconductor material films according to claim 62, wherein the planar face of the monocrystalline silicon wafer is substantially parallel to a 1,0,0 crystallographic plane of the monocrystalline silicon wafer.*

*69. Process for the preparation of thin semiconductor material films according to claim 68, wherein the hydrogen microbubbles are distributed in vicinity of the 1,0,0 crystallographic plane.*

*70. Process for the preparation of thin semiconductor material films according to claim 69, which further comprises cleaving the thin semiconductor material film from the substrate along the 1,0,0 crystallographic plane.*

* * * * *

UNITED STATES PATENT AND TRADEMARK OFFICE

CERTIFICATE OF CORRECTION

PATENT NO. : RE 39,484 E
APPLICATION NO. : 10/449786
DATED : February 6, 2007
INVENTOR(S) : Michel Bruel It is certified that error appears in the above-identified patent and that said Letters Patent is hereby corrected as shown below:

On the Title Page item (56), under Other Publications

Page 3, column 2, line 27, after "Gordon and" delete "B reach" and substitute --Breach-- in its place.

Page 3, column 2, line 41, before "of Jean-Pierre" delete "Reports" and substitute --Report-- in its place.

In the Claims

Column 7, in claim 8, line 4, delete "substrate" and substitute --substance-- in its place.

Column 9, in claim 35, line 3, after "*material wafer*" delete "*comrises*" and substitute --*comprises*-- in its place.

Column 9, in claim 36, line 3, after "*material wafer*" delete "*comrises*" and substitute --*comprises*-- in its place.

Column 9, in claim 37, line 3 after "*material wafer*" delete "*comrises*" and substitute --*comprises*-- in its place.

Column 9, in claim 38, line 3, after "*material wafer*" delete "*comrises*" and substitute --*comprises*-- in its place.

Signed and Sealed this

Fourth Day of March, 2008

JON W. DUDAS
*Director of the United States Patent and Trademark Office*